(12) United States Patent  (10) Patent No.: US 7,976,325 B2
Hsiao et al.  (45) Date of Patent: Jul. 12, 2011

(54) SOCKET FOR TESTING SEMICONDUCTOR PACKAGE

(75) Inventors: Shih-Wei Hsiao, Tu-Cheng (TW); Wei-Chih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/536,496

(22) Filed: Aug. 6, 2009

(65) Prior Publication Data

US 2010/0120269 A1 May 13, 2010

(30) Foreign Application Priority Data

Nov. 10, 2008 (TW) .................................. 97220136

(51) Int. Cl.
*H01R 11/22* (2006.01)
(52) U.S. Cl. ........................................ 439/266; 439/331
(58) Field of Classification Search .................. 439/266, 439/267, 72, 331, 73
See application file for complete search history.

(56) References Cited

U.S. PATENT DOCUMENTS

| 4,872,850 | A | * | 10/1989 | Mogi et al. | 439/264 |
| 5,240,430 | A | | 8/1993 | Soes | |
| 5,713,751 | A | * | 2/1998 | Fukunaga | 439/266 |
| 6,109,944 | A | * | 8/2000 | Takeyama | 439/266 |
| 6,213,803 | B1 | * | 4/2001 | Kato et al. | 439/266 |
| 6,540,537 | B1 | * | 4/2003 | Kawamura et al. | 439/266 |
| 7,775,821 | B2 | * | 8/2010 | Hsu et al. | 439/266 |
| 2001/0014550 | A1 | * | 8/2001 | Yamada | 439/266 |

FOREIGN PATENT DOCUMENTS

CN 201054407 Y 4/2008
EP 1091628 A 10/2001

* cited by examiner

*Primary Examiner* — Hien Vu
(74) *Attorney, Agent, or Firm* — Andrew C. Cheng; Wei Te Chung; Ming Chieh Chang

(57) ABSTRACT

A socket adapted for electrically connecting a semiconductor package to a printed circuit board, includes a main body defining a number of contact passageways and a plurality of contacts received in the contact passageways of the main body. Each contact has a base portion, a first contacting portion and a second contacting portion upwardly extending from the base portion, and a spring arm bent from a bottom edge of the base portion. The spring arm extends substantially in a horizontal direction and is bent downwardly at a free end thereof to form a tail. The spring arm can deform to provide an elastic force for the tail to press against the printed circuit board.

10 Claims, 4 Drawing Sheets

SOCKET FOR TESTING SEMICONDUCTOR PACKAGE

BACKGROUND OF THE INVENTION

1. Field of the Invention

The present invention relates to a socket, and more particularly to a socket being soldered to a printed circuit board and adapted for testing a semiconductor package.

2. Description of the Related Art

European Patent Application No. 1091628 discloses a typical socket of the like, which includes a main body, an operating cover and a plurality of contacts accommodated in the main body. The main body has a plurality of retaining holes. The operating cover is formed with a cam surface. The contact is integrally stamped from a metal sheet and includes a retaining leg engaging with the retaining hole of the main body, a body leg linking with a side of the retaining leg, a foot downwardly extending from a side of the body leg and a first and a second contacting portions disposed on another side of the body leg. The first contacting portion has an elastic portion, a first contacting arm, a haulm portion, a top end and a first contacting end on an end of the top end. The second contacting portion has a second contacting arm, an engaging portion and a second contacting end.

When an external force acts on the operating cover, the cam surface of the operating cover presses the haulm portion of the contact and separates the first contacting end from the second contacting end, at this moment, a guiding track of a semiconductor package is set upon the second contacting end. Upon the withdraw the external force, the operating cover then is pushed upwardly, then the guiding track of the semiconductor package is clamped by the first and the second contacting ends, so the socket electrically connects with the semiconductor package. The foot of the contact extends beyond the bottom side of the main body and is soldered to a pad on a printed circuit board to achieve an electrical connection between the semiconductor package and the printed circuit board.

The socket electrically connects to the printed circuit board by the foot of the contact thereof. However, since the foot is soldered onto the printed circuit board, the socket can not easily detach from the printed circuit board.

Hence, it is required to improve the disadvantages of the above sockets.

SUMMARY OF THE INVENTION

An object of the invention is to provide a socket, which is can be easily detached from a printed circuit board.

To achieve the above-mentioned object, a socket adapted for electrically connecting a semiconductor package and a printed circuit board, comprises: a main body defining a plurality of contact passageways and a plurality of contacts received in the contact passageways of the main body. Each contact has a base portion, a first contacting portion and a second contacting portion upwardly extending from the base portion, and a spring arm bent from a bottom edge of the base portion. The first portion and the second portion each is formed with a contacting point facing to each other, the spring arm extends substantially in a horizontal direction and is bent downwardly at a free end thereof to form a tail for pressing against the printed circuit board.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
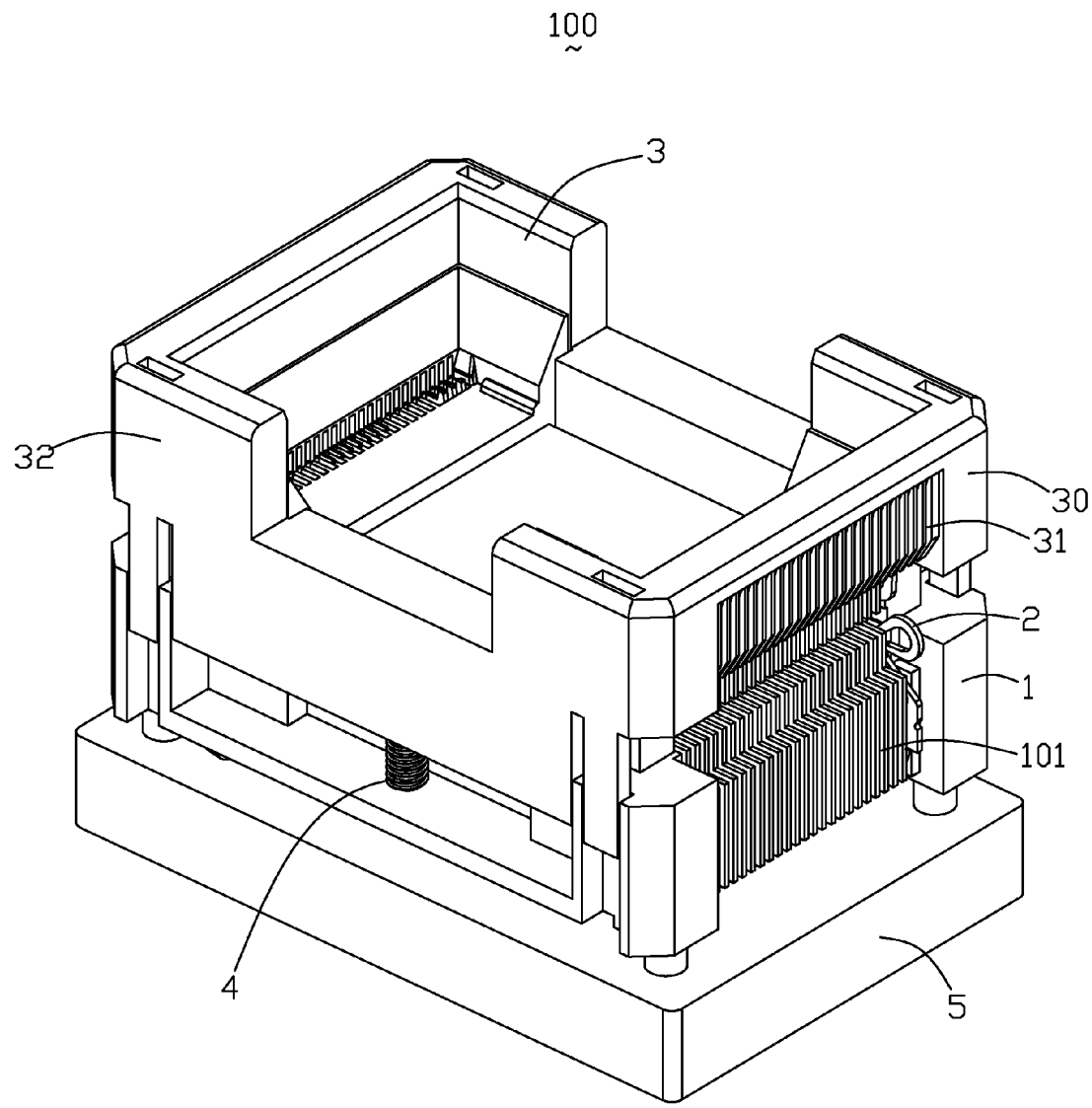
FIG. 1 is an assembled, perspective view of a socket in accordance with a preferred embodiment of present invention.

Reference will now be made in detail to the preferred embodiment of the present invention.

Referring to FIGS. 1-4, a socket 100, adapted for electrically connecting semiconductor package and printed circuit board, comprises a main body 1, a plurality of contacts 2 received in the main body 1, an operating cover 3 mounted upon the main body 1, a plurality of springs 4, a backplane 5 mounted below the main body 1 and bolts 6 retaining the backplane 5 below the main body 1.

Figure 2:
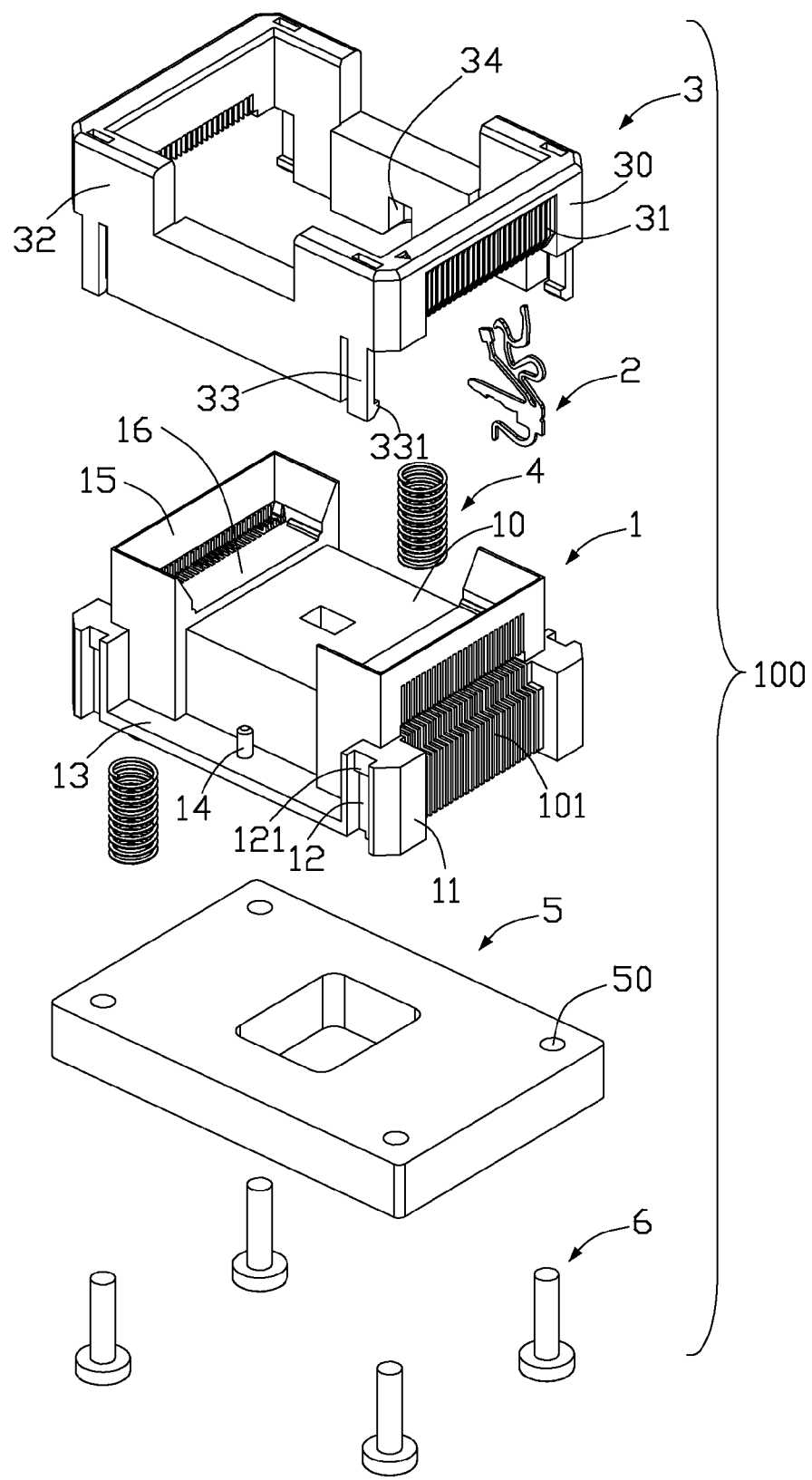
FIG. 2 is an exploded, perspective view of the socket in accordance with the preferred embodiment of present invention.
Figure 3:
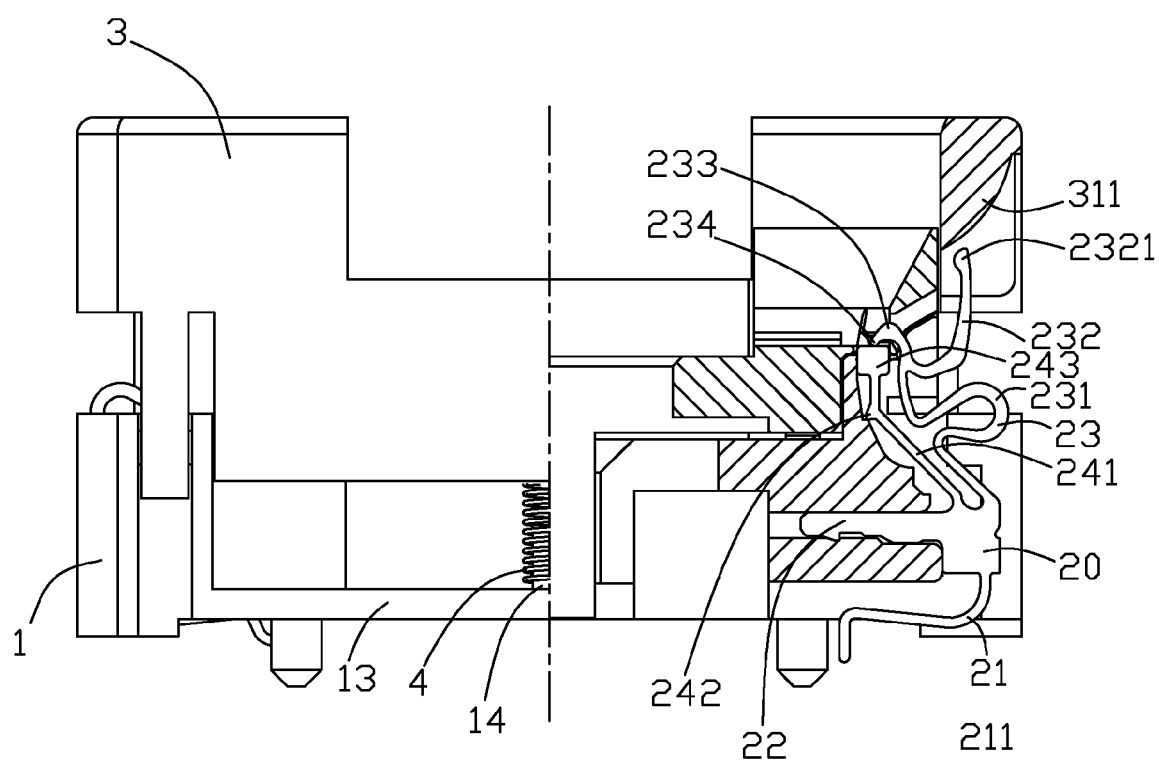
FIG. 3 is a partially, section view of the socket in accordance with the preferred embodiment of present invention.

Continue to referring to FIG. 2, the main body 1 is configured with a rectangular shape, and is formed with a base 10 along with a plurality of flanges 11 on four corners thereof. A plurality of sidewalls 15 extend upwardly from a peripheral of the base 10 and surround a receiving cavity 16 together. Each of the flanges 11 is provided with a channel 12, which guides the operating cover 3 to move upwardly and downwardly with respect to the main body 1 and has a protrusion 121 therein for retaining the operating cover 3 to the main body 1, the main body 1 defines a plurality of contact passageways 101 for receiving the contacts 2 on two opposite sides thereof and has a bottom board 13 extending outwardly from bottom portion of another two opposite sides thereof. The bottom board 13 is provided with a post 14 for retaining the spring 4 thereon.

Figure 4:
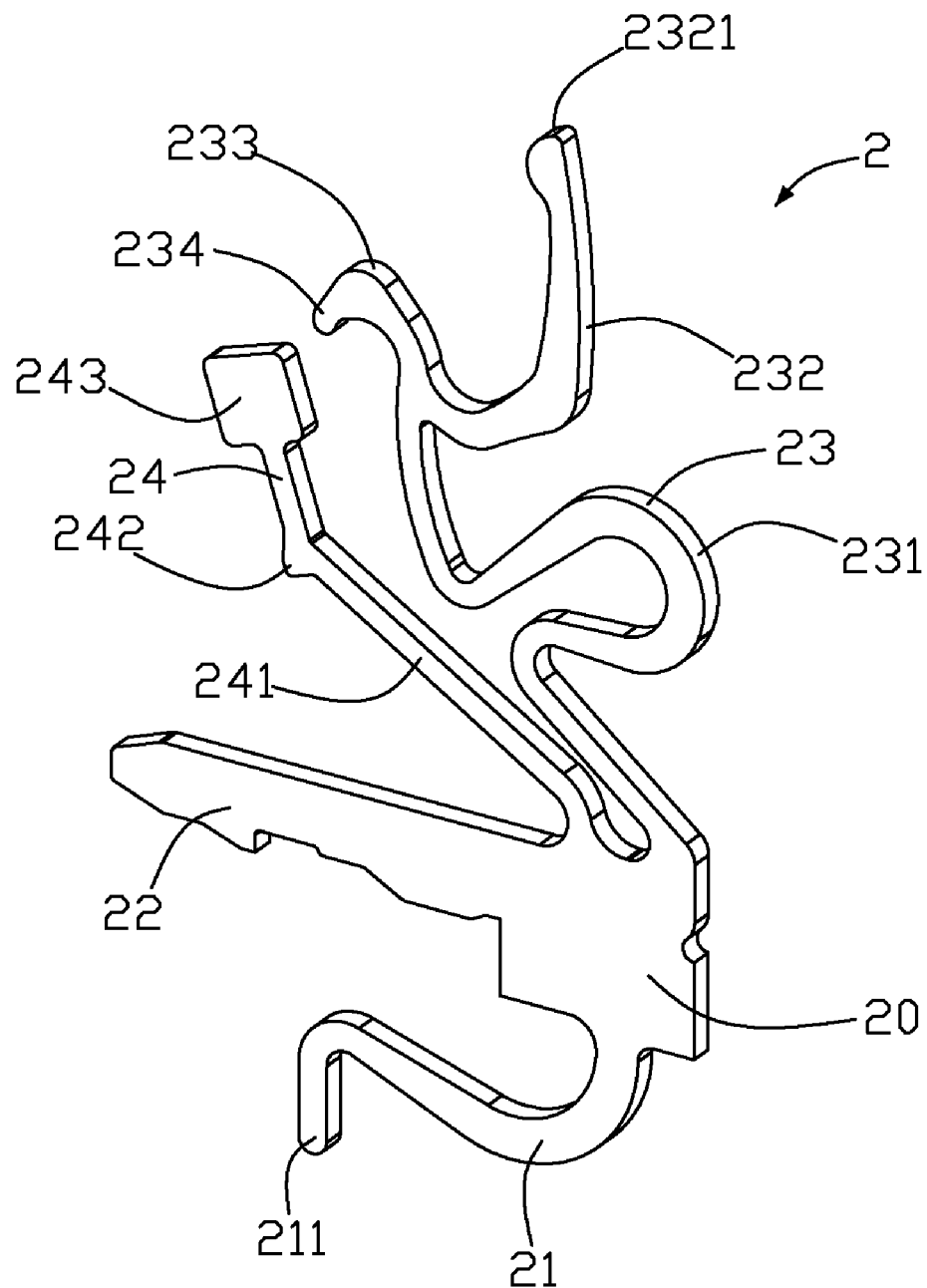
FIG. 4 is a perspective view of a contact of the socket.

Referring to FIG. 4, each of the contacts 2 has a base portion 20. A retaining portion 22 horizontally extends from a side of the base portion 20 to retain the contact 2 in the contact passageway 101 of the main body 1. The base portion 20 has a first contacting portion 23 and a second contacting portion 24 to clamp onto a guiding track (not shown) of the semiconductor package (not shown) to achieve electrical connection between the socket 100 and the semiconductor package (not shown). The first contacting portion 23 has an elastic portion 231 on a middle portion thereof, the elastic portion 231 has a branch arm 232 and a top end 233.

The top end 233 of the first contacting portion 23 is formed with a first contacting end 234 for contacting with the guiding track (not shown) of the semiconductor package (not shown). The branch arm 232 of the first contacting portion 23 is formed with an operating portion 2321 on a free end thereof. The second contacting portion 24 has a contacting arm 241 extending from the base portion 20 toward the first contacting end 234. A second contacting end 243 is formed on an end of the contacting arm 241 for contacting with a bottom side of the guiding track (not shown) of the semiconductor package (not shown). The contacting arm 241 has an engaging portion 242 for positioning the second contacting portion 24 on the main body 1. The base portion 20 is formed with a spring arm 21 on a bottom edge thereof, the spring arm 21 extends substantially in a horizontal direction and is bent downwardly at a free end thereof to form a tail 211 for pressing against the printed circuit board (not shown) and achieving an electrical connection between the socket 100 and the printed circuit board (not shown). The spring arm 21 and the retaining portion 22 are located in a same lateral side of the base portion 20.

The operating cover 3 is configured with a frame and is formed with two short sidewalls 39 with a plurality of slots 31 corresponding to the contact passageways 101 of the main body 1 for accommodating the branch arm 232 of the first contacting portion 23 of the contact 2. The slot 31 has a cam surface 311 therein for pushing the operating portion 2321 of the branch arm 232 of the contact 2 when the operating cover 3 is pressed downwardly to separate the first contacting end 234 from the second contacting end 243. The operating cover 3 has two long sidewalls 32 with latching portions 33 vertically and extending downwardly from four corners thereof. The latching portion 33 is formed with a claw 331 on a free end thereof, which can abut against the protrusion 121 of the main body 1 to retain the operating cover 3 on the main body 1. The long sidewall 32 of the operating portion 3 further defines a recess 34 corresponding to the post 14 of the main body 1 for receiving the spring 4 which provides an elastic force for upwardly movement of the operating cover 3.

The backplane 5 is a rectangle board-like, and defines a plurality of through holes 50 on four corners thereof for the bolts 6 passing through to mount the backplane 5 below the main body 1. When assembling, the contacts 2 are inserted into the contact passageways 101 of the main body 1 from a lateral side of the main body 1. Then, the socket 100 is mounted on the printed circuit board, the tails 211 of the spring arms 21 of the contacts 2 press the printed circuit board (not shown) to electrically connect the socket 100 with the printed circuit board (not shown). When a downwardly external force acts on the operating cover 3, the operating cover 3 will push the contacts 2 to depart the first contacting ends 234 from the second contacting ends 243. Then the semiconductor package (not shown) is disposed onto the main body 1, the guiding tracks are set on contacting surfaces of the second contacting ends 243 of the contacts 2. Then, upon the withdrawal of the external force, the first contacting ends 234 and the second contacting ends 243 corporately clamp the guiding tracks (not shown), so that the semiconductor package (not shown) electrically connects with the printed circuit board (not shown).

The socket 100 has following advantages: the spring arm 21 of the contact 2 contacts with the printed circuit board (not shown) by press-fit instead of soldering, so the socket 100 can easily detached from the printed circuit board (not shown).

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket adapted for electrically connecting a semiconductor package to a printed circuit board, comprising:
   a main body defining a plurality of contact passageways; and a plurality of contacts received in the contact passageways of the main body, each contact having a base portion, a first contacting portion with a first contact end and a second contacting portion with a first contact end, the first and second contacting portions upwardly extending from the base portion, the second contacting portion having an engaging portion space form the second contact end, a curved spring arm extending downwardly from a bottom edge of the base portion and then substantially in a horizontal direction, the first contacting portion and the second contacting portion each formed with a contacting end facing to each other, the curved spring arm formed with a downwardly extending tail on an end thereof and located in a free state so as to deflect upwardly when the tail is pressed upwardly by a backplane;
   wherein a plurality of bolts mount the backplane below the main body.

2. The socket as described in claim 1, wherein the contact has a retaining portion to retain the contact in the main body, and the spring arm and the retaining portion are located in a same lateral side of the base portion.

3. The socket as described in claim 2, wherein the retaining portion extends from a lateral edge of the base portion of the contact.

4. The socket as described in claim 2, wherein the first contacting portion has a branch arm upwardly extending from a side of the first contacting portion.

5. The socket as described in claim 4, further having an operating cover, the operating cover moves downwardly to operate the branch arm and separate the first contacting end from the second contacting end, when the operating cover moves back, the first contacting end moves toward the second contacting end.

6. An electrical connector comprising:
   an insulative base defining a plurality of side walls surrounding a receiving cavity;
   an insulative cover mounted upon the base and moveable relative to the base in a vertical direction;
   a plurality of contacts disposed along said side walls, each of said contacts defining a horizontal retaining portion horizontally assembled inwardly into the base from an exterior of the side walls, an upper resilient contacting section with a contact end and an engaging portion space from the contact end, extending above the retaining portion toward the receiving cavity, and a lower curved spring arm mounting section extending below the retaining portion away from the receiving cavity for detachable engagement with a printed circuit board on which the base is seated;
   wherein the curved spring arm is bent from a bottom edge of a base portion of the curved spring arm and extends substantially in a horizontal direction and has a downwardly extending tail at a free end thereof.

7. The electrical connector as claimed in claim 6, wherein said cover activates the upper resilient contacting section to move when said cover is moved in said vertical direction.

8. The electrical connector as claimed in claim 7, wherein downward movement of said cover in said vertical direction urges the upper resilient contacting section to move away from the receiving cavity for leaving the corresponding lead of the IC package.

9. The electrical connector as claimed in claim 6, wherein each of said contacts further includes another upper contacting section to cooperate with said upper resilient contacting section for sandwiching the corresponding lead of the IC package therebetween.

10. The electrical connector as claimed in claim 9, wherein all said upper contacting section, said another upper contacting section and said mounting section extend from a same end region of said retaining portion.

* * * * *